United States Patent
McElheny et al.

(10) Patent No.: US 7,045,427 B2
(45) Date of Patent: May 16, 2006

(54) POLYSILICON GATE DOPING LEVEL VARIATION FOR REDUCED LEAKAGE CURRENT

(75) Inventors: Peter McElheny, Morgan Hill, CA (US); Priya Selvaraj, San Jose, CA (US); Yow-Juang (Bill) Liu, San Jose, CA (US); Francois Gregoire, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 1 day.

(21) Appl. No.: 10/830,359

(22) Filed: Apr. 22, 2004

(65) Prior Publication Data

US 2005/0003601 A1 Jan. 6, 2005

Related U.S. Application Data

(63) Continuation-in-part of application No. 10/156,267, filed on May 28, 2002, now Pat. No. 6,750,106.

(60) Provisional application No. 60/332,137, filed on Nov. 16, 2001.

(51) Int. Cl.
*H01L 21/8234* (2006.01)

(52) U.S. Cl. .............. 438/275; 438/232; 438/301; 438/306; 438/532; 438/591

(58) Field of Classification Search ............. 438/216, 438/232, 275, 276, 289–291, 299, 301, 306, 438/527, 532, 591, 592
See application file for complete search history.

(56) References Cited

U.S. PATENT DOCUMENTS

| | | | | |
|---|---|---|---|---|
| 6,030,861 A | * | 2/2000 | Liu | 438/217 |
| 6,100,143 A | * | 8/2000 | Brown et al. | 438/296 |
| 6,136,656 A | * | 10/2000 | Brown et al. | 438/294 |
| 6,362,056 B1 | * | 3/2002 | Tonti et al. | 438/275 |

* cited by examiner

*Primary Examiner*—Kevin M. Picardat
(74) *Attorney, Agent, or Firm*—L. Cho

(57) ABSTRACT

A method for fabricating a transistor on a semiconductor substrate includes varying a polysilicon doping level near a first and second edge of a diffusion region with a polysilicon doping level of a center region of a polysilicon region.

15 Claims, 9 Drawing Sheets

POLYSILICON GATE DOPING LEVEL VARIATION FOR REDUCED LEAKAGE CURRENT

RELATED APPLICATIONS

This application is a continuation-in-part of and claims the benefit under Title 35 United States Code, Section 120 of U.S. application Ser. No. 10/156,267 filed on May 28, 2002 now U.S. Pat. No. 6,750,106, entitled "POLYSILICON GATE DOPING LEVEL VARIATION FOR REDUCED LEAKAGE CURRENT" which claims the benefit of the priority date of U.S. Provisional Application 60/332,137 filed on Nov. 16, 2001 under 35 U.S.C. §119(e).

FIELD OF THE INVENTION

The present invention relates to the field of semiconductor integrated circuits. More specifically, the present invention relates to a method and apparatus for reducing leakage current and improving power consumption for n-type channel metal oxide semiconductor (NMOS) and p-type channel metal oxide semiconductor (PMOS) transistors.

BACKGROUND

Power consumption is an issue for advanced integrated circuit parts such as transistors. Tunneling leakage current (gate leakage) and standby leakage current (source drain leakage) contribute to the power consumption problem.

One approach used in the past to address tunneling leakage currents in transistors was to fabricate the transistors with a thicker gate dielectric. This approach, however, had several drawbacks. First, fabricating a transistor with a thicker gate dielectric involved multiple gate oxidations. This required additional time and resources for implementing additional processes during manufacturing which was undesirable. Second, although fabricating the transistor with a thicker gate dielectric reduced the tunneling leakage current when the transistor was in an ON state, the approach did not address the standby leakage current when the transistor was in an OFF state. On the contrary, fabricating the transistor with a thicker gate dielectric increased the amount of standby leakage current generated between the source and drain which was undesirable.

Thus, what is needed is an efficient and effective approach to addressing both tunneling leakage current and standby leakage current.

SUMMARY

A method for fabricating transistors on a semiconductor substrate which addresses both tunneling leakage current and standby leakage current is disclosed. By reducing the polysilicon doping level of the transistor, the polysilicon depletion region of the transistor is increased when the transistor is in an ON state. This has the effect of allowing a transistor with a relatively thin physical gate dielectric to behave as if having a relatively thick effective gate dielectric when in the ON state. By varying the polysilicon doping level of transistors on the semiconductor substrate, the method of the present invention allows fabrication of transistors having varying effective gate dielectric thickness without physically varying the actual gate dielectric thickness of the transistors. This reduces the number of complex dielectric production steps that may be needed for the fabrication of transistors on a semiconductor substrate.

A method of fabricating transistors on a semiconductor substrate is disclosed according to a first embodiment of the present invention. Gate dielectrics of equal thickness are provided to a first and second transistor on the semiconductor substrate. A polysilicon doping level of the first transistor is varied with a polysilicon doping level of the second transistor.

A method for fabricating transistors on a semiconductor substrate is disclosed according to a second embodiment of the invention. A polysilicon region of a first transistor on the semiconductor substrate is blocked while a polysilicon region of a second transistor on the semiconductor substrate is exposed. Exposed regions are doped with charges.

A method for fabricating transistors on a semiconductor substrate is disclosed according to a third embodiment of the present invention. A gate, source, and drain is formed for each of a first and second transistor on the semiconductor substrate. A polysilicon region that defines the gate of the second transistor is blocked while a polysilicon region that defines the gate of the first transistor is exposed. Exposed regions are counter doped with charges.

A method for fabricating a transistor on a semiconductor substrate is disclosed according to an embodiment of the present invention. A polysilicon doping level near a first and second edge of a diffusion region is varied with a polysilicon doping level of a center region of a polysilicon region.

A semiconductor substrate is disclosed according to an embodiment of the present invention. The semiconductor substrate includes a first transistor having a gate dielectric of a first thickness and a gate with a first level of polysilicon doping. The semiconductor substrate includes a second transistor having a gate dielectric of the first thickness and a gate with a second level of polysilicon doping.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

A method and apparatus for reducing leakage current and improving power consumption in transistors is described. In the following description, numerous specific details are set forth, such as specific materials and processes, in order to provide a thorough understanding of the present invention. It should be appreciated that the invention may be practiced without these specific details. In other instances, well-known semiconductor equipment and processes have not been described in particular detail in order to avoid unnecessarily obscuring the present invention.

Figure 1:
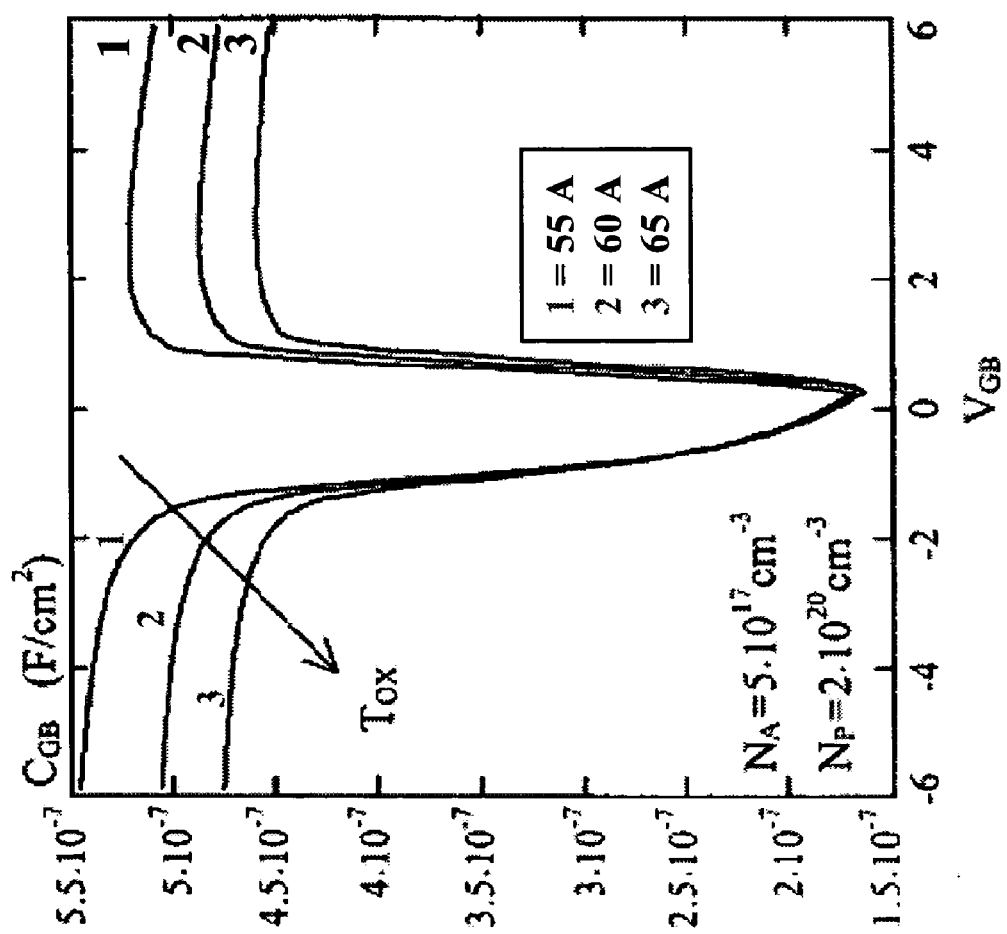
FIG. 1 illustrates the relationship between capacitance and voltage for transistors with varying gate oxide thickness values.

FIG. 1 is a chart that illustrates the relationship between capacitance and voltage for three transistors with varying gate oxide thickness values. The characteristics of a first transistor, having a gate oxide thickness of 55 A, a second transistor, having a gate oxide of 60 A, and a third transistor, having a gate oxide thickness of 65 A, are labeled as curves 1, 2, and 3 respectively. All three transistors have a constant polysilicon doping level. The polysilicon doping level may be defined as being the amount of charge (N+ in an NMOS transistor or P+ in an PMOS transistor) doped into a transistor's polysilicon region. Typically, the doping process involves either thermal diffusion or ion implantation. As shown in FIG. 1, the transistors with greater gate oxide thickness exhibits lower capacitance.

Figure 2:
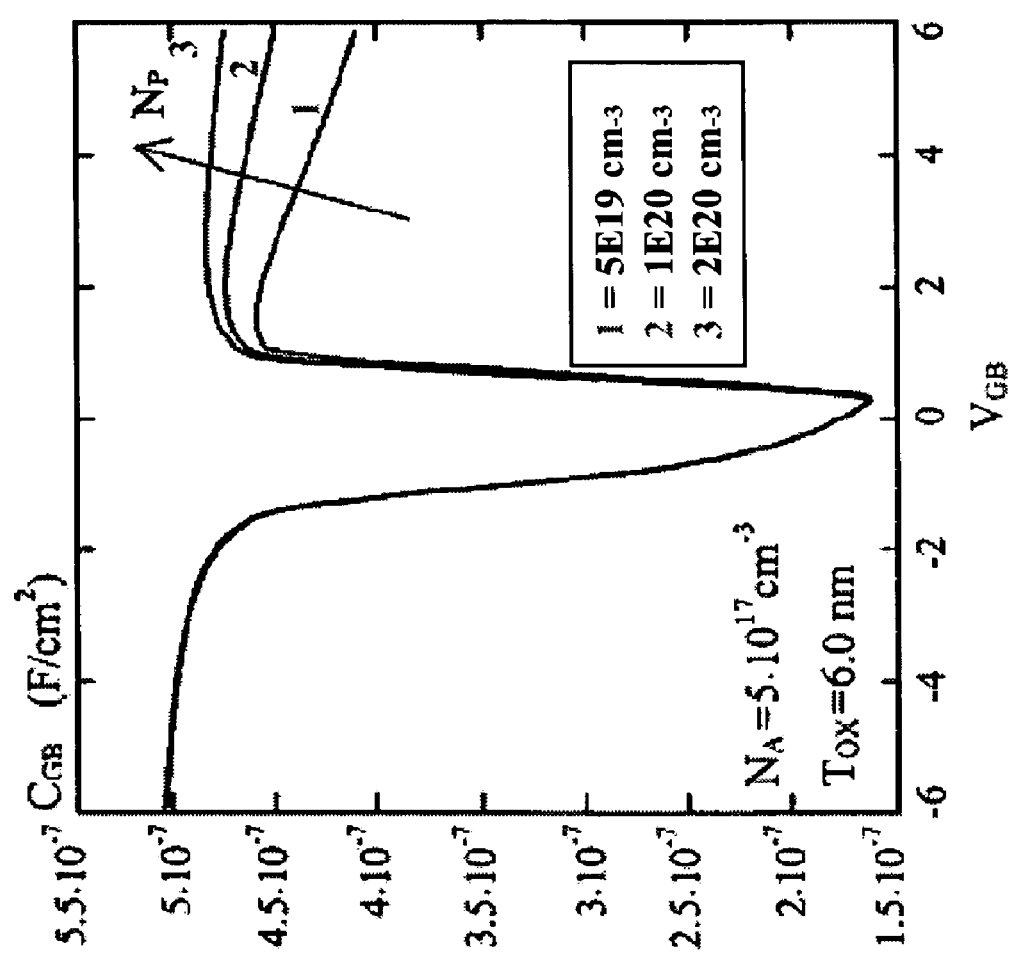
FIG. 2 illustrates the relationship between capacitance and voltage for transistors with varying polysilicon doping levels.

FIG. 2 is a chart that illustrates the relationship between capacitance and voltage for three transistors with varying polysilicon doping levels. The characteristics of a first transistor, having a polysilicon doping level of 5E19 cm3, a second transistor, having a polysilicon doping level of 1E20 cm3, and a third transistor, having a polysilicon doping level of 2E20 cm3, are labeled as curves 1, 2, and 3 respectively. All three transistors have the same gate oxide thickness. As shown in FIG. 2, the transistors with lower polysilicon doping levels exhibits lower capacitance.

FIGS. 1 and 2 illustrate how varying the polysilicon doping level of a transistor has the effect of varying the effective gate oxide thickness of the transistor for the purposes of affecting leakage current. By decreasing the polysilicon doping level of a transistor, the capacitance voltage behavior of the transistor changes as if the gate oxide thickness is increased for voltage levels greater than zero. For example, decreasing the polysilicon doping level from 1E20 cm−3 to 5E19 cm−3 has the effect of increasing the effective gate oxide thickness by 4.3 A. Likewise, decreasing the polysilicon doping from 2E20 cm−3 to 1E20 cm−3 has the effect of increasing the effective gate oxide thickness by 3 A.

Tunneling leakage occurs through the gate dielectric of a transistor. The tunneling leakage is a function of the gate dielectric thickness. The thinner the gate dielectric layer, the easier it is for current to tunnel through. When a voltage is applied across the material stack of a transistor, the voltage drops across the polysilicon gate, the bulk silicon, and the gate dielectric. The larger the voltage is that is applied across the gate dielectric, the larger the tunneling current is that is generated due to the higher electric field. According to an embodiment of the present invention, the polysilicon doping level of a transistor may be adjusted such that more of the total voltage applied across the material stack drops across the polysilicon. This would result in reducing the voltage drops across the gate dielectric which would reduce the amount of tunneling leakage current of the transistor.

In the OFF state of a transistor, appreciable leakage no longer occurs through tunneling of the gate dielectric between the gate and the drain. Instead, standby leakage occurs through the bulk silicon between the source and the drain. During the OFF state of the transistor, the gate voltage is set at zero volts. This couples the gate onto the bulk silicon and helps reduce the leakage. When the gate dielectric behaves electrically thinner, the bulk is more strongly coupled to the zero voltage on the gate, which yields less leakage between the source and drain.

According to an embodiment of the present invention, decreasing the polysilicon doping level of a transistor allows the effective gate dielectric thickness of the transistor to be increased without actually increasing the physical gate dielectric thickness of the transistor. Thus by decreasing the polysilicon doping level of a transistor, the transistor may be modified to electrically behave as if it has a thicker gate dielectric when in the ON state and behave as if it has its actual gate dielectric thickness when it is in the OFF state.

To allow for more or less gate depletion in polysilicon gates, the doping profile may be selectively varied for different transistors as a way to modulate effective gate dielectric thickness. This may be achieved by blocking the polysilicon region of selected transistors during fabrication processes that involve doping the polysilicon regions of the transistors on the semiconductor substrate. Fabrication processes that involve doping the polysilicon regions of the transistors on the semiconductor substrate include specific polysilicon pre-doping/doping used for reducing the resistive properties and increasing the conductive properties of the polysilicon gate, semiconductor substrate doping to create n-type or p-type regions for the source and drain junctions, and other doping processes.

According to an embodiment of the present invention, to allow for more gate depletion and a thicker effective gate dielectric, the polysilicon regions of selected transistors are blocked during the polysilicon pre-doping and/or doping process. According to an embodiment of the present invention, to allow for more gate depletion and a thicker effective gate dielectric, the polysilicon regions of selected transistors are blocked during source-drain N+/P+ doping. According to an embodiment of the present invention, to allow for more gate depletion and a thicker effective gate dielectric, the polysilicon doping level of a transistor may be varied by counter doping the polysilicon with charges such as N+ or P+. It should be appreciated that any one or combination of these techniques may be used to vary the doping profile.

Figure 3:
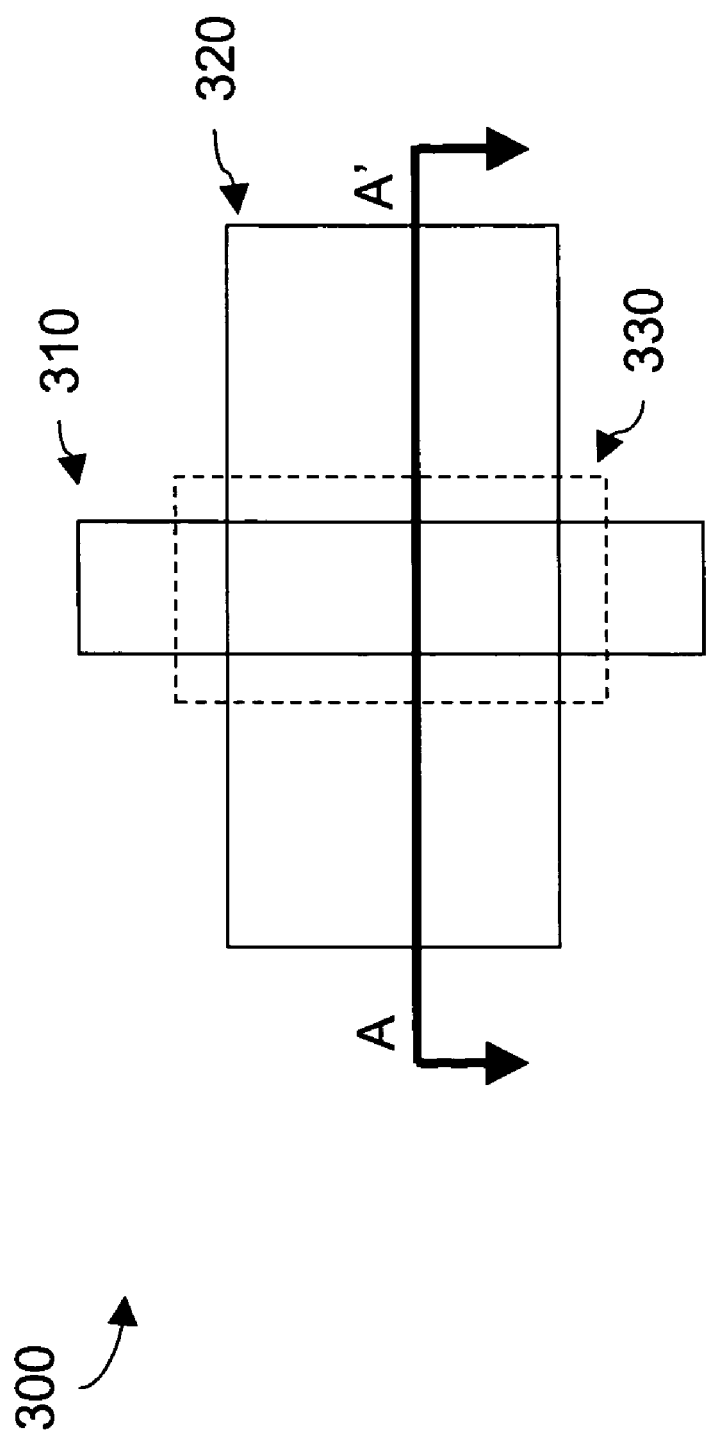
FIG. 3 illustrates a top down view of a transistor having its polysilicon region blocked according to an embodiment of the present invention.

FIG. 3 illustrates a top down view of a transistor 300 according to an embodiment of the present invention. The transistor 300 includes a diffusion area 320 that resides in the bulk silicon (not shown) of the transistor 300. The transistor includes a polysilicon region 310. The portion of the polysilicon region 310 that forms the transistor 300 may be blocked during a polysilicon doping process. According to an embodiment of the present invention, the portion of the polysilicon region 310 that forms the transistor 300 may be blocked using a photolithography process. This may involve covering the semiconductor substrate with a photoresist material, covering the portion of the polysilicon region 310 forming the transistor 300 with a mask, and exposing the unmasked region of the semiconductor substrate with ultraviolet light. The implant mask is represented by the dashed lines 330. The area inside the implant mask 330 is where a special polysilicon doping profile may be defined.

Figure 4:
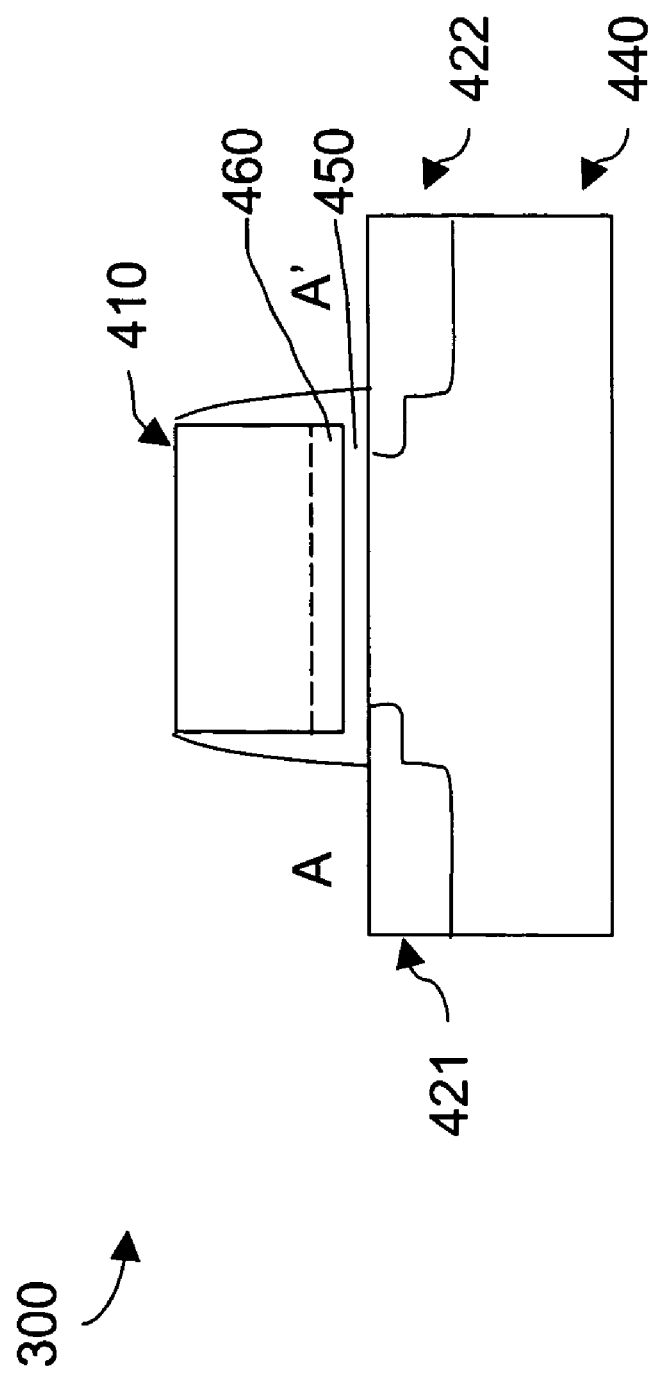
FIG. 4 illustrates a cross sectional view of the semiconductor substrate illustrated in FIG. 3 from point A–A' during an ON state.

FIG. 4 illustrates a cross sectional view of the transistor illustrated in FIG. 3 from point A–A' when the transistor is in the ON state. The transistor 300 includes a gate 410 formed by a portion of the polysilicon 310 shown in FIG. 3. The transistor 300 includes a source 421 and a drain 422 formed by a portion of the diffusion region 320 (shown in FIG. 3) in the bulk silicon 440. The transistor 300 includes a gate dielectric 450 under the gate 410. When the transistor is in the ON state, the voltage at the source, Vs, is zero. The voltage at the gate, Vg, and the voltage at the drain, Vd, is at Vcc. When the transistor is in the ON state, the polysilicon region becomes depleted. The polysilicon depletion region is shown as 460. During the ON state, the effective gate dielectric thickness of the transistor is greater than the physical thickness of the gate dielectric of the transistor due to the depletion of the polysilicon region. This has the effect of reducing the tunneling leakage current.

Figure 5:
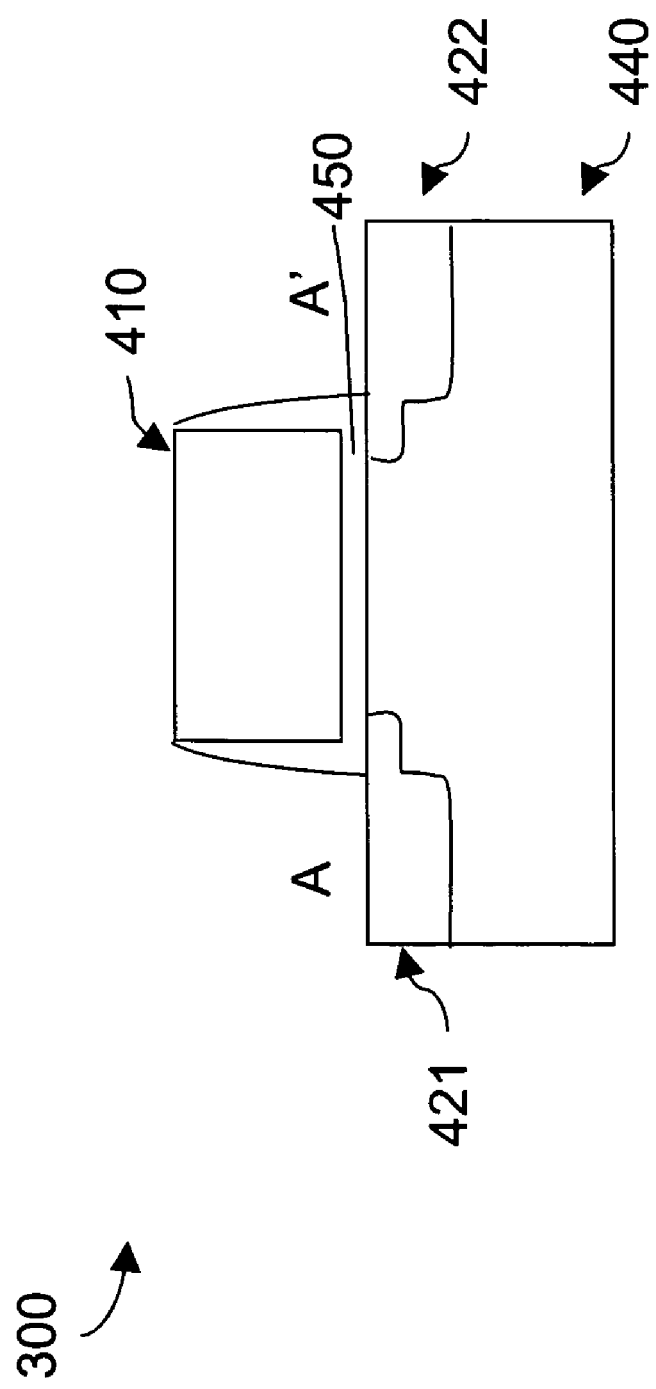
FIG. 5 illustrates a cross sectional view of the semiconductor substrate illustrated in FIG. 3 from point A–A' during an OFF state.

FIG. 5 illustrates a cross sectional view of the transistor illustrated in FIG. 3 from point A–A' when the transistor is in the OFF state. When the transistor is in the OFF state, the voltage at the source, Vs, and the voltage at the gate, Vg, is equal to zero. The voltage at the drain, Vd, is at Vcc. During the OFF state, there is no polysilicon gate depletion. Thus, the effective gate dielectric thickness is equal to the physical gate dielectric thickness.

Figure 6A:
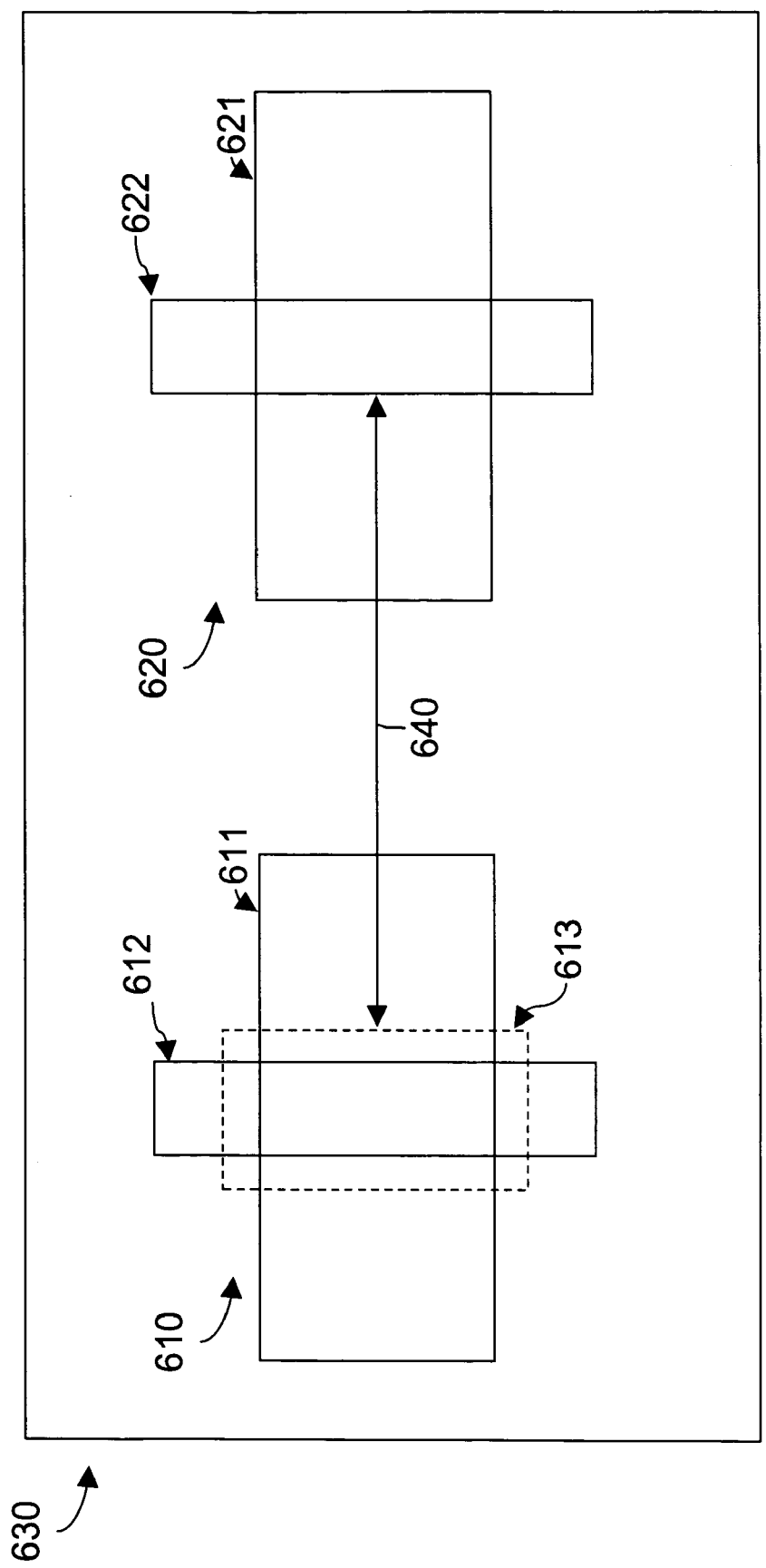
FIGS. 6a and 6b illustrate how varying the effective gate oxide thickness of transistors provides improved efficiency for transistor fabrication layout.

FIGS. 6a and b illustrates how the technique of varying the effective gate dielectric thickness of transistors provides improved efficiency for transistor fabrication layout over varying the actual effective gate dielectric thickness. FIG. 6a illustrates a layout of a first transistor 610 and a second transistor 620 on a semiconductor substrate 630. The transistor 610 includes a diffusion area 611 that resides in the bulk silicon (not shown) of the transistor 610. The transistor includes a polysilicon region 612. According to an embodiment of the present invention, a portion of the polysilicon region 612 that forms the transistor 610 may be blocked during a polysilicon doping process in order to modify the effective gate dielectric (not shown) thickness of the transistor 610. Dashed lines 613 represent a mask used in the blocking process. The transistor 620 similarly includes a diffusion area 621 and a polysilicon region 622. When designing a fabrication layout for transistors 610 and 620, where polysilicon regions are blocked from doping, the distance between an implant edge to an edge of a non-implanted polysilicon of the next transistor, shown by arrow 640, is what is relevant in determining how the transistors should to be spaced apart. The distance represented by arrow 640 prevents the mask region 613 from being placed over the polysilicon region 622, an unwanted situation that may arise from the worst-case mask mis-alignment.

Figure 6B:
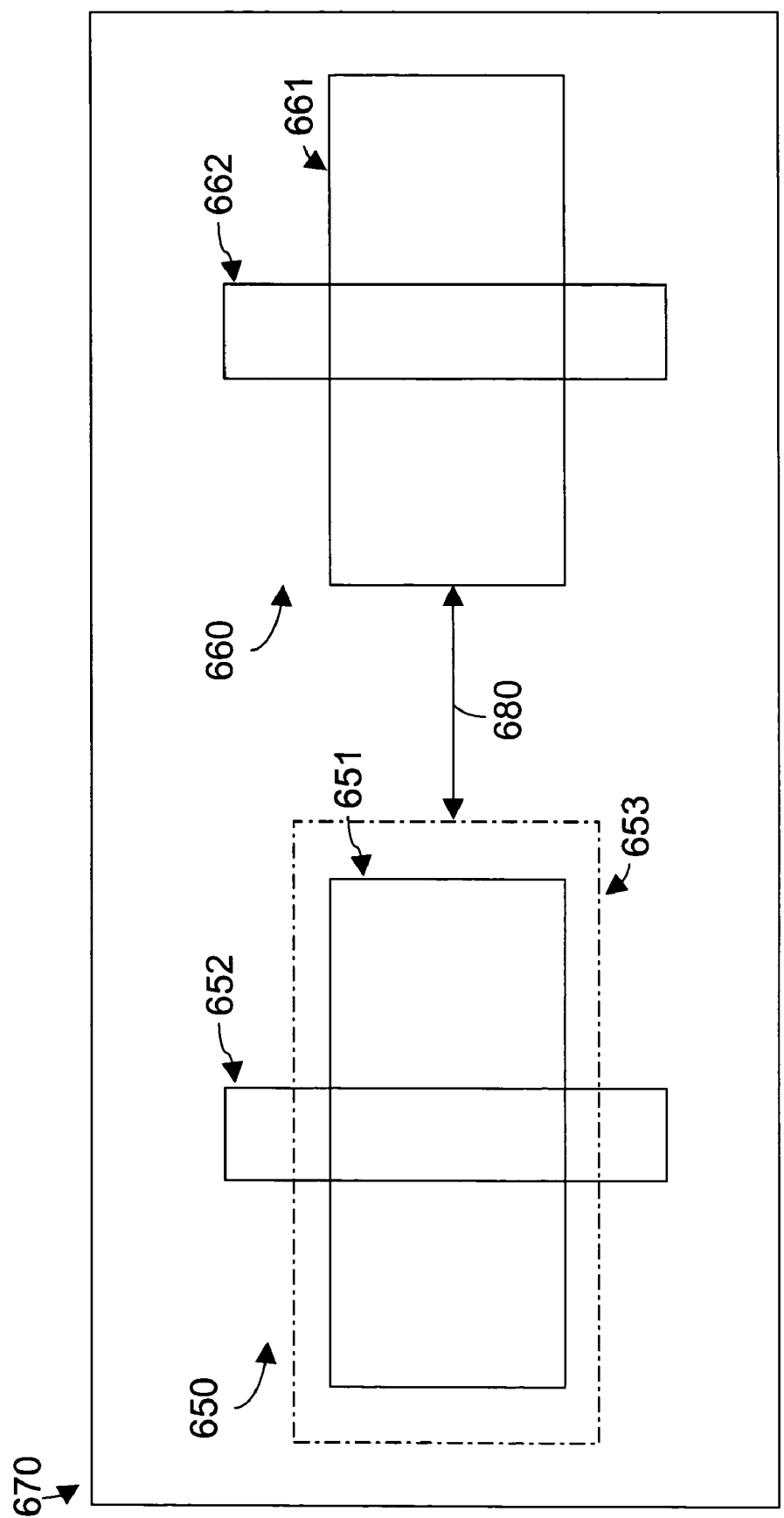

FIG. 6b illustrates a layout of a first transistor 650 and a second transistor 660 on a semiconductor substrate 670. The transistor 650 includes a diffusion area 651 and a polysilicon region 652. Transistor 650 has been processed in order to increase its actual gate dielectric thickness. This process involves the utilization of a thick oxide mask represented by dashed lines 653. The transistor 660 similarly includes a diffusion area 661 and a polysilicon region 662. When designing a fabrication layout for transistors 650 and 660 where diffusion regions have different gate dielectric thickness achieved by more than one oxidation step and selective etching of oxide for the thin oxide regions, the distance between the increased gate dielectric thickness of transistor 650 and the gate dielectric of transistor 660, shown by arrow 680, is what is relevant in determining how the transistors should to be spaced apart. The distance represented by arrow 680 prevents the thin oxide etch from happening inside the thick oxide mask region 653, an unwanted situation that may arise from the worst-case mask mis-alignment. As shown in FIGS. 6a and 6b, the restrictions for fabrication layout have less of an impact on spacing distances between transistors when the technique of modifying the effective gate dielectric of a transistor is used.

Figure 7:
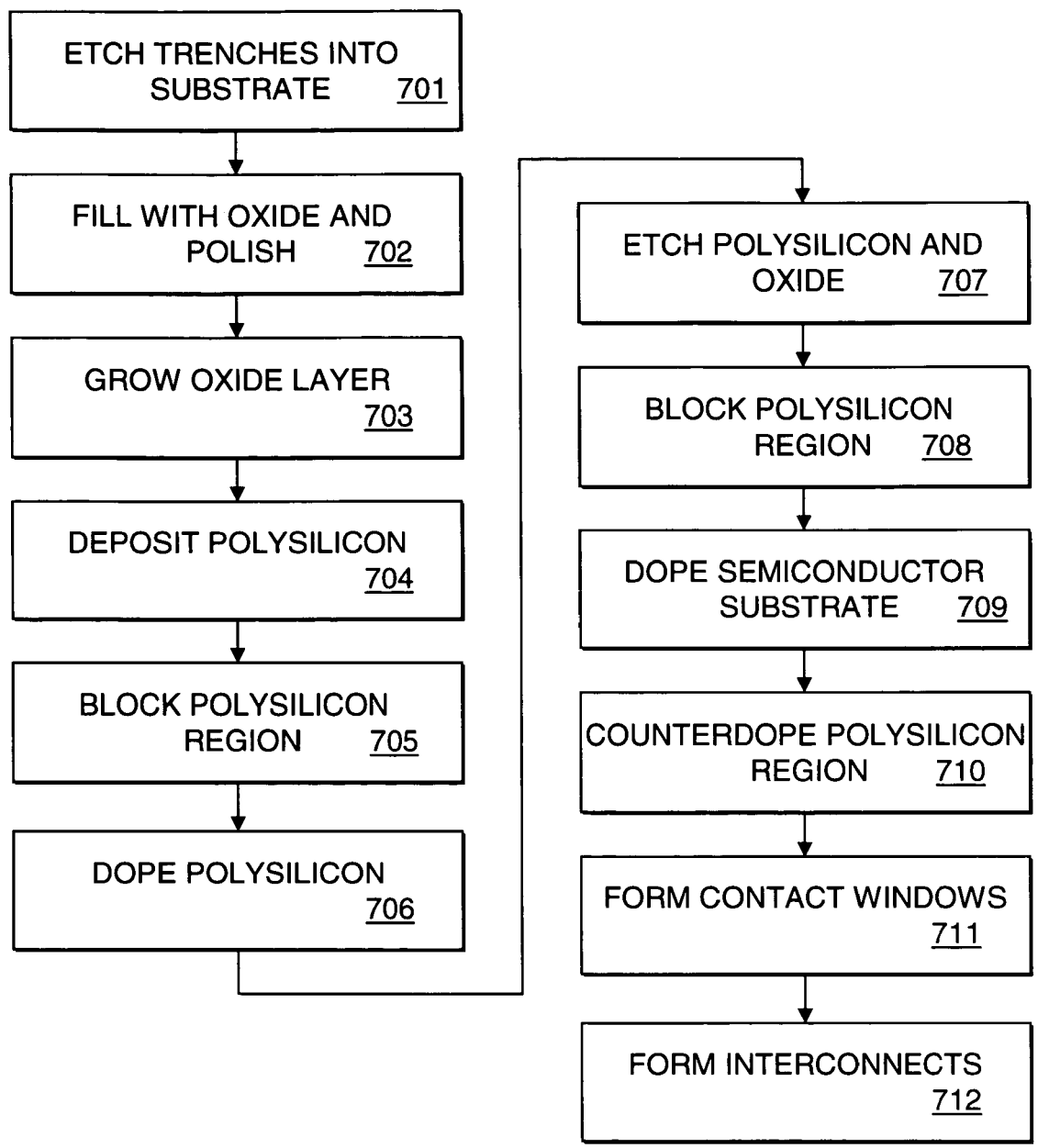
FIG. 7 is a flow chart that illustrates a method for fabricating transistors on a semiconductor substrate according to an embodiment of the present invention.

FIG. 7 is a flow chart that illustrates a method for fabricating transistors on a semiconductor substrate according to an embodiment of the present invention. At step 701, the semiconductor substrate has trenches etched into it. The semiconductor substrate may be a silicon substrate.

At step 702, the trenches are filled with oxide and polished. The polishing exposes the silicon surface on which the metal oxide semiconductor transistors will be created.

At step 703, an oxide layer is grown. The oxide layer may be used as the gate dielectric for the transistors.

At step 704, a thin layer of polysilicon (polycrystalline silicon) is deposited on top of the oxide. Polysilicon may be used as gate electrode material for the metal oxide semiconductor transistors.

At step 705, polysilicon regions of transistors selected to have a reduced polysilicon doping level may be blocked. According to one embodiment, the polysilicon regions may be blocked using a photolithography process. This may involve covering the semiconductor substrate which the transistors are on with a photoresist material, covering the portion of the polysilicon regions forming the transistors with a mask, and exposing the unmasked region of the semiconductor substrate with ultraviolet light. It should be appreciated that either positive or negative photoresist may be used in the photolithography process and that other techniques may be used to block the polysilicon regions.

At step 706, the exposed polysilicon regions of transistors on the semiconductor substrate are doped. According to one embodiment, the polysilicon regions are doped with impurity atoms in order to reduce the resistive properties and increase the conductive properties of the polysilicon regions. It should be appreciated that steps 705 and 706 may be repeated together any number of times. For example, the fabrication process may repeat steps 705 and 706 twice where the first time step 706 is referred to as a pre-doping step and a second time step 706 is referred to as a doping step.

At step 707, the polysilicon layer and oxide layer are etched. The polysilicon layer may be patterned and etched to form the interconnects and the metal oxide semiconductor transistor gates. The oxide not covered by polysilicon may also be etched away to expose the bare silicon on which source and drain junctions are to be formed.

At step 708, polysilicon regions of transistors selected to have a reduced polysilicon doping level may be blocked. The polysilicon regions of the transistors selected may be blocked using the techniques as described in step 705.

At step 709, the semiconductor substrate is doped. The entire silicon surface may be doped with a high concentration of impurities, either through diffusion or ion implantation. The doping penetrates exposed areas on the silicon surface creating n-type or p-type regions (source and drain junctions) in the p-type or n-type substrate.

At step 710, polysilicon regions of transistors selected to have a reduced polysilicon doping level may be counter doped.

At step 711, contact windows are formed. The entire surface of the silicon substrate may be covered with an insulating layer of silicon dioxide. The insulating oxide layer may be patterned to provide contact windows for drain and source junctions.

At step 712, interconnects are formed. The surface of the semiconductor may be covered with a metal layer such as evaporated aluminum or electroplated copper. The metal layer may be patterned and etched to form the interconnections of the metal oxide semiconductor transistors on the surface or the patterns may be etched into the inter-metal dielectric, filled by electroplating, and polished to form the interconnections of the metal oxide semiconductor transistors on the surface.

FIG. 7 illustrates a flow chart describing a method for fabricating transistors on a semiconductor substrate. Some of the steps illustrated in these figures may be performed in an order other than that which is described. It should be appreciated that not all of the steps described are required to be performed, that additional steps may be added, and that some of the illustrated steps may be substituted with other steps. For example, steps 705, 708, and 710 may be used to vary the polysilicon doping level of selected transistors. It should be appreciated that not all of these steps need to be used to vary the polysilicon doping level of selected transistors and that one may selectively choose one or more of these steps depending on a doping profile of the selected transistors.

Figure 8:
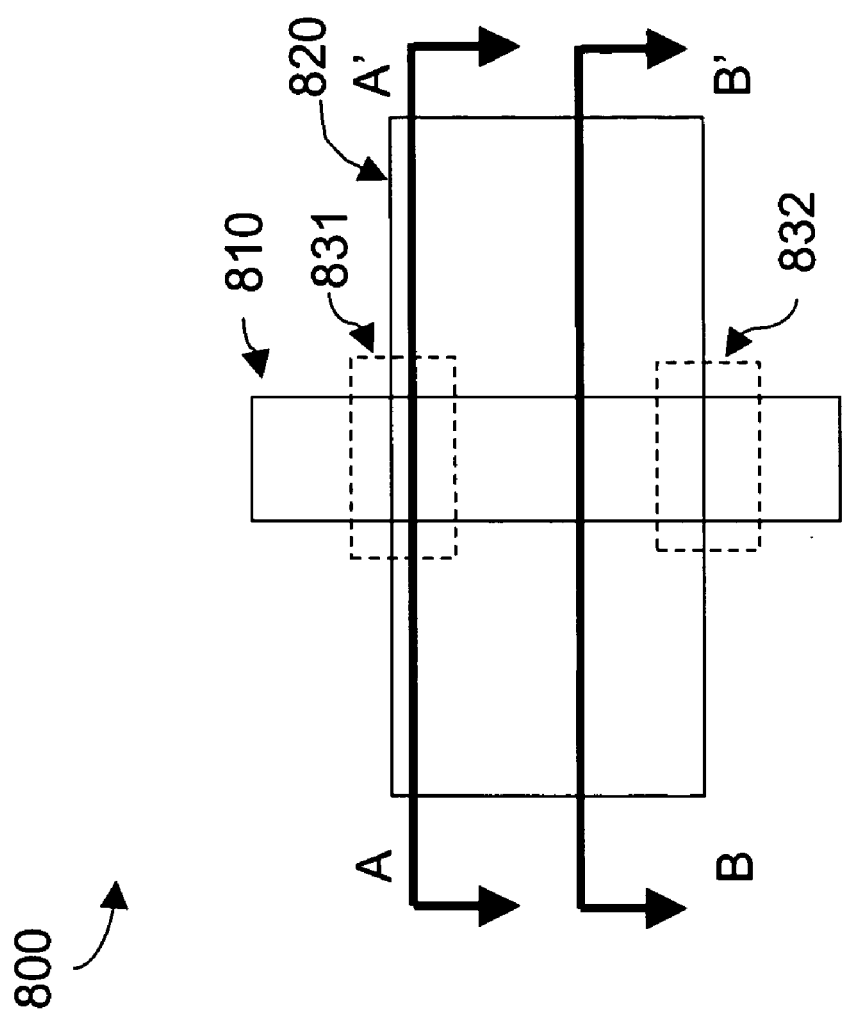
FIG. 8 is a top down view of a transistor having a first and second edge of its polysilicon region blocked according to an embodiment of the present invention.

FIG. 8 is a top down view of a transistor 800 according to an embodiment of the present invention. The transistor 800 includes a diffusion area 820 and a polysilicon region 810. A first and second area of the polysilicon region 810 near the edges of the diffusion area 820 may be blocked during a polysilicon doping process. According to an embodiment of the present invention, the area of the polysilicon region 810 near the edges of the diffusion area 820 may be blocked using a photolithography process. This may involve covering the semiconductor substrate which the transistor is on with a photoresist material, covering the portion of the polysilicon region 810 forming the transistor 800 with a mask, and exposing the unmasked region of the semiconductor substrate with ultraviolet light. The implant mask is represented by the dashed lines 831 and 832. When the transistor 800 is in the ON state, the areas of the polysilicon region 810 that are blocked will experience noticeable polysilicon depletion. Thus, the area of the polysilicon marked by points A–A' will have a noticeable polysilicon depletion region. Whereas, the area of the polysilicon marked by points B–B' (intersecting the center region of the polysilicon region 810) will not have a noticeable polysilicon depletion region.

It should be appreciated that the polysilicon doping level at the first and second area of the polysilicon region 810 near the edges of the diffusion area 820 may be varied with the polysilicon doping level of the center region of the polysilicon region 810 during other parts of the fabrication process using other techniques, procedures, and processes described with reference to FIGS. 3–7. For example, with reference to FIG. 7, the polysilicon doping level at the first and second area of the polysilicon region 810 near the edges of the diffusion area 820 may be varied with the polysilicon doping level of the center region of the polysilicon region 810 during a polysilicon doping process (706) where an undoped polysilicon region 810 is blocked. The polysilicon doping level at the first and second area of the polysilicon region 810 near the edges of the diffusion area 820 may be varied or further varied with the polysilicon doping level of the center region of the polysilicon region 810 during a doping process (708) where charge implantation is performed. The polysilicon doping level at the first and second area of the polysilicon region 810 near the edges of the diffusion area 820 may be varied or further varied with the polysilicon doping level of the center region of the polysilicon region 810 during a counter doping process (710).

Transistors often have the hottest carriers in polysilicon regions near the edges of the diffusion area due to the lower threshold voltage of these regions. This is from either gate electrode narrowing or from inverse narrow width effects. By blocking the polysilicon doping level at the areas of the polysilicon region 810 near the edges of the diffusion area 820, the hot carrier effect in the transistor 800 may be reduced.

By selectively varying the doping profile on selected transistors, it is possible to reduce the tunnel leakage current through the gate dielectric without the need for the more complex dual-dielectric or triple-dielectric processing. This approach may be applied in-line to account for variations in the gate dielectric thickness on a per lot basis. This approach may also help reduce the hot carrier effect and improve reliability of transistors.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for fabricating a transistor on a semiconductor substrate, comprising:
varying a polysilicon doping level of a first and second area near a first and second edge of a diffusion region in a length direction of the transistor with a polysilicon doping level of a center region of a polysilicon region by blocking an undoped polysilicon region near the first and second edge of the diffusion region during a polysilicon doping process to prevent doping of the undoped polysilicon region near the first and the second edge of the diffusion region, wherein the first and second area extend beyond an entire polysilicon region in the length direction of the transistor.

2. The method of claim 1, further comprising varying the polysilicon doping level of the first and second area with the polysilicon doping level of the center region by blocking polysilicon regions near the first and second edge of the diffusion region during a charge implantation process.

3. The method of claim 1, further comprising varying the polysilicon doping level of the first and second area with the polysilicon doping level of the center region by counter doping polysilicon regions near the first and second edge of the diffusion region.

4. The method of claim 1, wherein blocking the undoped polysilicon region near the first and second edge comprises:
applying a photoresist over the semiconductor substrate;
covering the polysilicon region of the first and second edge with a mask; and
applying ultraviolet light.

5. The method of claim 2, wherein blocking the undoped polysilicon region near the first and second edge comprises:
applying a photoresist over the semiconductor substrate;
covering the polysilicon region of the first and second edge with a mask; and
applying ultraviolet light.

6. The method of claim 1, wherein the polysilicon doping process is achieved by ion implantation.

7. The method of claim 1, wherein the polysilicon doping process is achieved by thermal diffusion.

8. A method for fabricating a transistor on a semiconductor substrate, comprising:
varying a polysilicon doping level of a first and second area near a first and second edge of a diffusion region in a length direction of the transistor with a polysilicon doping level of a center region of a polysilicon region, wherein the first and second area extend beyond an entire polysilicon region in the length direction of the transistor.

9. The method of claim 8, wherein varying the polysilicon doping level of the first and second area near the first and second edge of the diffusion region with a polysilicon doping level of the center region comprises blocking an undoped polysilicon region near the first and second edge of the diffusion region of the transistor during a polysilicon doping process.

10. The method of claim 8, wherein varying the polysilicon doping level of the first and second area near the first and second edge of the diffusion region with a polysilicon doping level of the center region comprises blocking a first and second edge of the diffusion region of the transistor during a charge implantation process for source and drain regions of the transistor.

11. The method of claim 8, wherein varying the polysilicon doping level of the first and second area near the first and second edge of the diffusion region with a polysilicon doping level of the center region comprises counter doping polysilicon regions near the first and second edge of the diffusion region of the transistor.

12. The method of claim 9, wherein blocking the undoped polysilicon region near the first and second edge comprises:
   applying a photoresist over the semiconductor substrate;
   covering the polysilicon region of the first and second edge with a mask; and
   applying ultraviolet light.

13. The method of claim 10, wherein blocking the undoped polysilicon region near the first and second edge comprises:
   applying a photoresist over the semiconductor substrate;
   covering the polysilicon region of the first and second edge with a mask; and
   applying ultraviolet light.

14. The method of claim 9, wherein the polysilicon doping process is achieved by ion implantation.

15. The method of claim 9, wherein the polysilicon doping process is achieved by thermal diffusion.

* * * * *